US011280881B2

(12) United States Patent
Conway et al.

(10) Patent No.: US 11,280,881 B2
(45) Date of Patent: Mar. 22, 2022

(54) RADAR SYSTEM FOR DETECTING PROFILES OF OBJECTS, PARTICULARLY IN A VICINITY OF A MACHINE WORK TOOL

(71) Applicant: RodRadar Ltd, Rinatya (IL)

(72) Inventors: Simon Conway, Warwickshire (GB); John Roulston, Edinburgh (GB)

(73) Assignee: RodRadar Ltd., Rinatya (IL)

( * ) Notice: Subject to any disclaimer, the term of this patent is extended or adjusted under 35 U.S.C. 154(b) by 205 days.

(21) Appl. No.: 16/163,799

(22) Filed: Oct. 18, 2018

(65) Prior Publication Data

US 2019/0129001 A1    May 2, 2019

(30) Foreign Application Priority Data

Oct. 31, 2017   (GB) ...................................... 1717995

(51) Int. Cl.
   *G01S 7/28*     (2006.01)
   *G01S 13/88*    (2006.01)
   (Continued)

(52) U.S. Cl.
   CPC .............. *G01S 7/288* (2013.01); *E02F 9/261* (2013.01); *G01S 7/282* (2013.01); *G01S 13/10* (2013.01);
   (Continued)

(58) Field of Classification Search
   CPC ....................................................... G01S 7/288
   (Continued)

(56) References Cited

U.S. PATENT DOCUMENTS 4,480,327 A    10/1984  Vance
5,003,312 A *   3/1991  Madni ...................... G01S 7/38
                                                     327/231
(Continued)

FOREIGN PATENT DOCUMENTS

CN    105093227       11/2015
CN    105093227 A  *  11/2015   ........... G01S 13/343
(Continued)

OTHER PUBLICATIONS

Search Report for related United Kingdom Application No. 1717995.3; report dated Apr. 27, 2017.
(Continued)

*Primary Examiner* — Erin F Heard
*Assistant Examiner* — Helena H Seraydaryan
(74) *Attorney, Agent, or Firm* — Heidi Brun Associates Ltd.

(57) ABSTRACT

A radar system is disclosed for detecting profiles of objects, particularly in a vicinity of a machine work tool. The radar system uses a direct digital synthesiser to generate an intermediate frequency off-set frequency. It also uses an up-converter comprising a quadrature mixer, single-side mixer or complex mixer to add the off-set frequency to the transmitted frequency. It further uses a down-converter in the receive path driven by the off-set frequency as a local oscillator. The radar system enables received information to be transferred to the intermediate frequency. This in turn can be sampled synchronously in such a way as to provide a complex data stream carrying amplitude and phase information. The radar system is implementable with a single transmit channel and a single receive channel.

13 Claims, 9 Drawing Sheets

(51) Int. Cl.
  *G01S 7/288* (2006.01)
  *E02F 9/26* (2006.01)
  *G01S 7/282* (2006.01)
  *G01S 13/10* (2006.01)
  *H01Q 1/22* (2006.01)
  *H03D 3/00* (2006.01)
  *H03G 3/30* (2006.01)
  *G01S 13/86* (2006.01)
  *E02F 3/40* (2006.01)
  *G01S 13/28* (2006.01)

(52) U.S. Cl.
  CPC ......... *G01S 13/885* (2013.01); *H01Q 1/2283* (2013.01); *H03D 3/007* (2013.01); *H03G 3/3052* (2013.01); *E02F 3/40* (2013.01); *G01S 7/2886* (2021.05); *G01S 13/282* (2013.01); *G01S 13/86* (2013.01)

(58) Field of Classification Search
  USPC ........................................................ 342/202
  See application file for complete search history.

(56) References Cited

U.S. PATENT DOCUMENTS

| | | |
|---|---|---|
| 5,159,710 A | 10/1992 | Cusdin |
| 5,311,550 A | 5/1994 | Fouche et al. |
| 6,469,661 B1 | 10/2002 | Doerry et al. |
| 8,098,198 B2 | 1/2012 | Thiesen et al. |
| 9,071,326 B2 | 6/2015 | Koppelaar et al. |
| 2002/0049044 A1 | 4/2002 | Indseth |
| 2004/0012517 A1 | 1/2004 | Abou-Jaoude et al. |
| 2008/0119716 A1 | 5/2008 | Boric-Lubecke et al. |
| 2008/0159370 A1 | 7/2008 | Atherton |
| 2012/0154207 A1 | 6/2012 | Kim et al. |
| 2013/0234879 A1 | 9/2013 | Wilson-Langman et al. |

FOREIGN PATENT DOCUMENTS

| | | | |
|---|---|---|---|
| EP | 2293097 | 3/2011 | |
| EP | 2293097 A2 * | 3/2011 | ............. G01S 7/288 |
| EP | 3021178 | 5/2016 | |
| EP | 3021178 A1 * | 5/2016 | ........... G01S 13/867 |
| GB | 2350004 A | 11/2000 | |
| WO | 0196901 | 12/2001 | |
| WO | WO-0196901 A2 * | 12/2001 | ........... G01S 7/4004 |
| WO | WO 2015/050618 A2 | 4/2015 | |

OTHER PUBLICATIONS

Angel Bravo, et al., "Digital Quadrature Demodulator With Four Phases Mixing for Digital Radio Receivers", IEEE Transactions On Circuits And Systems-II: Analog And Digital Signal Processing, Dec. 2003, vol. 50, No. 12, pp. 1011-1015.

* cited by examiner

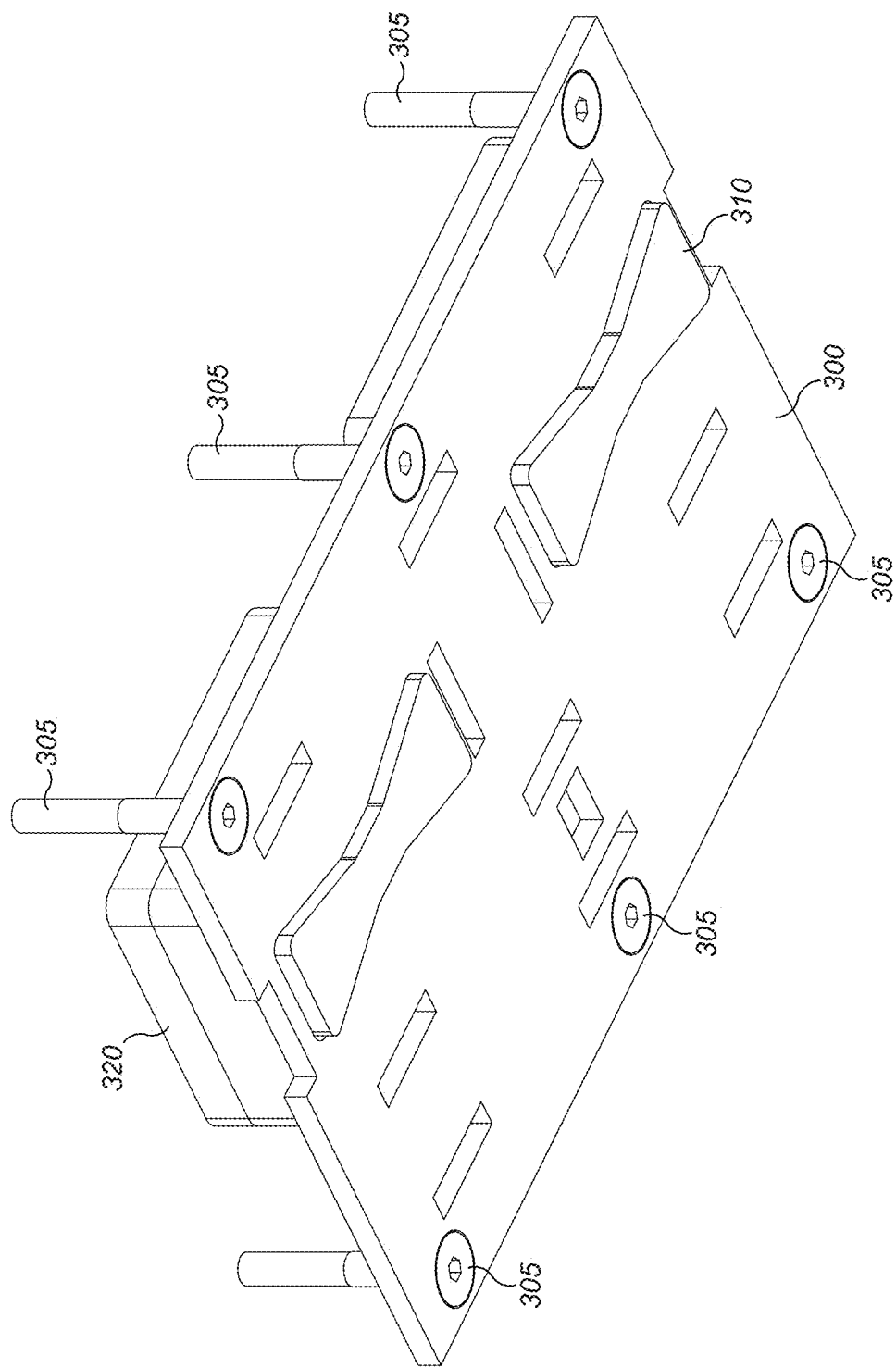

RADAR SYSTEM FOR DETECTING PROFILES OF OBJECTS, PARTICULARLY IN A VICINITY OF A MACHINE WORK TOOL

CROSS-REFERENCE TO RELATED APPLICATION

This application claims priority under 35 USC § 119 and the Paris Convention to United Kingdom Patent Application No. 1717995.3 filed on Oct. 31, 2017.

TECHNICAL FIELD

The disclosure relates to the field of radar systems, particularly for compact, close range applications. One application would be ground penetration radar in the context of a machine work tool such as an excavator bucket.

BACKGROUND

Radar systems that detect the presence of objects in an environment are well known, including ground penetrating radar systems. The majority of such systems employ a pulsed radar technique, such that they transmit a train of short pulses (impulses) of electromagnetic energy with a high peak power (e.g. of the order of tens of kilowatts). The pulse energy is reflected by dielectric discontinuities such that the radar receives echoes in one to one correspondence with the transmitted pulses. This energy is reflected by dielectric discontinuities and received by the radar to produce a profile of the subsurface objects. This allows a profile of the reflecting objects to be produced. Since the time intervals involved are very short (typically sub-nanosecond), the sampling of the echoes must be stroboscopic. To obtain high resolutions, such systems require large instantaneous bandwidth and high peak power. This results in a wastage of energy since the interval of echo delay must be visited sequentially, whereas each transmission penetrates and excites echoes from the entire delay space.

Stepped frequency radar systems overcome many of the issues just described in relation to impulse radar systems. In particular, the energy efficiency of a stepped radar frequency system is much higher than that of a pulsed radar system. However, stepped frequency radar systems tend not to be employed in small scale, low cost radar systems because of difficulties in implementation, generally resulting in higher cost.

There are two approaches to stepped frequency radar systems, homodyne and heterodyne. Homodyne systems are simple to implement but require detection of signals at DC with competition against flicker noise and DC drift. Heterodyne systems require use of a sinusoidal carrier mixed to an intermediate frequency. This necessitates phase coherence between the transmitted and received signals which, in turn, requires a second receiver to sample the outgoing signal. This arrangement, however, introduces substantial complexity because of the need to match the two receivers accurately.

Digital frequency generation (Direct Digital Synthesis (DDS)) is not capable of operating directly at the frequencies required for a ground penetrating radar and requires at least frequency doubling, which is costly.

SUMMARY OF THE DISCLOSURE

Against this background there is provided a radar system in accordance with claim 1.

The use of a direct digital synthesiser to generate an intermediate frequency (I.F.) off-set frequency; an up-converter comprising a quadrature mixer, single-side mixer or complex mixer to add the off-set frequency to the transmitted frequency; and a down-converter in the receive path driven by the off-set frequency as a local oscillator, enables the received information to be transferred to the I.F. frequency. This in turn can be sampled synchronously in such a way as to provide a complex data stream carrying amplitude and phase information. In this way, there is no need for a second receiver to recover the transmitted phase since phase coherence is intrinsic to the scheme. Accordingly, the system is implementable with only a single transmit channel and a single receive channel.

Furthermore, the radar system is implementable using a single analogue printed circuit board (PCB) and a single digital PCB. Moreover, the low bandwidth achieved using low frequency I.F. reduces the sampling frequency required in digitising so that the data transfer between the analogue and digital PCBs is achievable via the serial programmable interface (SPI) of the digital PCB. This has a beneficial impact on cost since the need for custom interface circuitry is removed.

Accordingly, the radar system of the present disclosure is low power, low data bandwidth and low cost, while achieving a high measurement bandwidth at radio frequency (R.F.).

BRIEF DESCRIPTION OF THE DRAWINGS

An embodiment of the invention is now described with reference to the accompanying drawings, in which:

FIG. 9 shows the antenna assembly 303 of FIG. 8 in isolation.

DETAILED DESCRIPTION

Figure 1:
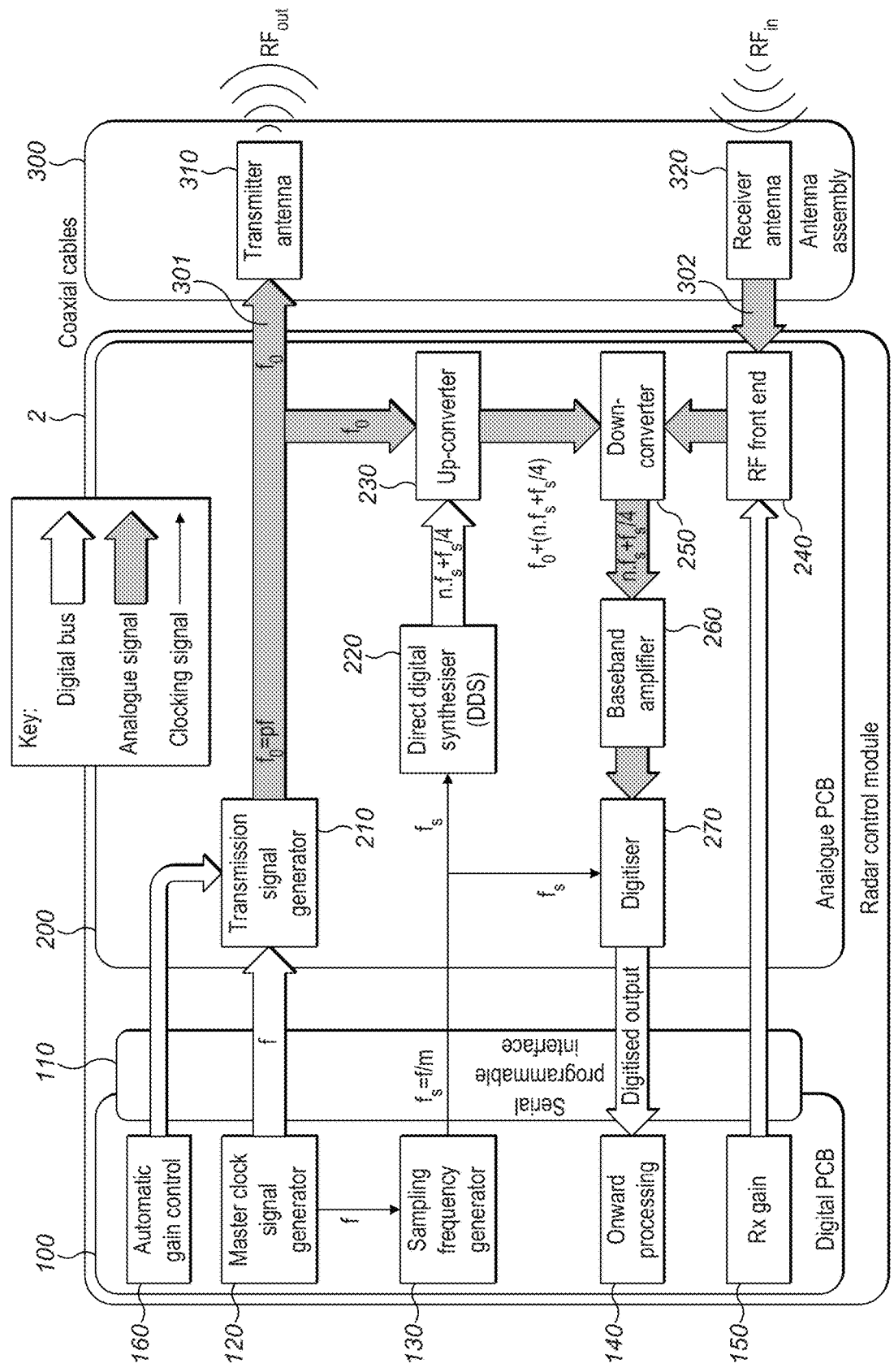
FIG. 1 shows a schematic representation of a radar system in accordance with the disclosure.

A radar system 1 in accordance with the present disclosure is shown in a highly schematic fashion in FIG. 1.

The radar system 1 comprises an antenna assembly 300 and a radar control module 2 comprising a digital PCB 100 and an analogue PCB 200.

The antennal assembly may comprise a transmitter antenna 310 and a receiver antenna 320. The transmitter antenna 310 may be configured to transmit electromagnetic radiation into the environment surrounding the transmitter antenna 310. The receiver antenna 320 may be configured to receive electromagnetic radiation from the environment surrounding the receiver antenna 320. The transmitter antenna 310 and receiver antenna 320 may be highly directional and co-directed such that the receiver antenna 320 is located so as to receive echoes of electromagnetic radiation emitted by the transmitter antenna 310.

The digital PCB 100 may be an off-the-shelf digital PCB comprising a serial programmable interface 110 by which data may be transferred onto and off the digital PCB 100.

The digital PCB 100 may comprise a master clock signal generator 120 that provides a master clock signal, f, that governs the timings within the radar system 1. The digital PCB 100 may further comprise a sampling frequency generator 130. The master clock signal f may be supplied to the sampling frequency generator 130 which uses, the master clock signal f to calculate a sampling frequency $$f_s = \frac{f}{m}$$

from the master clock signal, where m is an integer.

In a specific embodiment, it may be that the master clock signal f=10 MHz, integer m=25 and the sampling frequency $f_s$=400 kHz.

The digital PCB 100 may further comprise an automatic gain controller 160 configured to output a gain control signal.

The digital PCB 100 may further comprise a receiver gain controller 150 and a processor 140 for processing data received, each of which are explained in more detail later.

The analogue PCB 200 may comprise a transmission signal generator 210 configured to receive the master clock signal, f, from the master clock signal generator. The amplitude of the transmitted signal may be controlled via the serial programmable interface. The frequency may also be controlled via the serial programmable interface to be an integer p times the master clock frequency, f. Hence, the transmission signal generator 210 may generate a transmission signal having a frequency $f_0$=pf. The transmission signal may be output from the analogue PCB 200 to the transmitter antenna 310 via a coaxial cable 301.

The analogue PCT 200 may further comprise a direct digital synthesiser (DDS) 220 configured to receive the sampling frequency signal $$\left(f_s = \frac{f}{m}\right)$$

from the sampling frequency generator 130 and to use the sampling frequency signal to generate a synthesiser output signal which is a complex sinusoid synchronous to the master clock signal, f. The sinusoid uses in phase (I) and quadrature (Q) components that are mutually orthogonal.

The synthesiser output signal may be defined by the following equation:

$$n \cdot f_s + \frac{f_s}{4}.$$

The analogue PCB 200 may further comprise an up-converter 230 configured to receive the transmission signal directly from the transmission signal generator 210 and to receive the synthesiser output, signal. The up-converter 230 may be configured to upward convert the transmission signal and the synthesiser output signal to produce an up-converter output.

The up-converter 230 may be a complex mixer, a quadrature mixer or a single sideband mixer. The output of the up-converter 230 may be in accordance with the following equation:

$$f_0 + \left(n \cdot f_s + \frac{f_s}{4}\right).$$

The up-converter 230 outputs substantially only the upper sideband at $$f_0 + \left(n \cdot f_s + \frac{f_s}{4}\right),$$

since the carrier at $f_0$ and the lower sideband at $$f_0 - \left(n \cdot f_s + \frac{f_s}{4}\right)$$

are largely suppressed.

The analogue PCB 200 may further comprise an RF front end module 240 configured to receive a received signal from the receiver antenna 320 via a coaxial cable 302. The RF front end module 240 may be further configured to receive a receiver gain signal from the receiver gain controller 150 of the digital PCB 100. The received signal from the receiver antenna 320, as influenced by she receiver gain signal, may be output to a down-converter 250 of the analogue PCB 200. The down-converter 250 may be a passive double balanced mixer and may output a signal.

The down-converter 250 may receive the $$f_0 + \left(n \cdot f_s + \frac{f_s}{4}\right)$$

signal from the up-converter 230 and the output, $f_0$, from the RF front end 240. By impressing the echo information $f_0$ on the up-converter output, a signal defined by $$n \cdot f_s + \frac{f_s}{4}$$

may be restored by the down-converter 250.

The analogue PCB 200 may further comprise a baseband amplifier 260 configured to amplify the signal output by the down-converter 250.

The analogue PCB 200 may further comprise a digitiser 270 configured to convert the analogue signal output by the baseband amplifier 260 into a digital signal. The digitiser 270 may be clocked at $f_s$. Accordingly, the output spectrum from the digitiser is translated to $$\frac{f_s}{4}$$

through the mixing process of the sampling, which provides an output that is independent of the value of n.

Since the output of the baseband amplifier 260 which is input to the digitizer 270 remains in accordance with the equation $$n\cdot f_s+\frac{f_s}{4},$$

the resulting digital data stream comprises interleaved orthogonal components in the format I, −Q, −I, Q (wherein the I, Q terminology is the standard terminology for complex sampling).

The DDS 220 may have limited amplitude resolution (for example, 10 bits). In most applications, limited amplitude resolution would result in low signal to noise level due to amplitude quantisation. (In the 10 bit example, the signal to noise level may be limited to −65 dB.) However, the synchronism and the relationship between clock signal $f_s$ used by both the DDS 220 and the digitiser 270 means that quantizing noise is eliminated.

Figure 2:
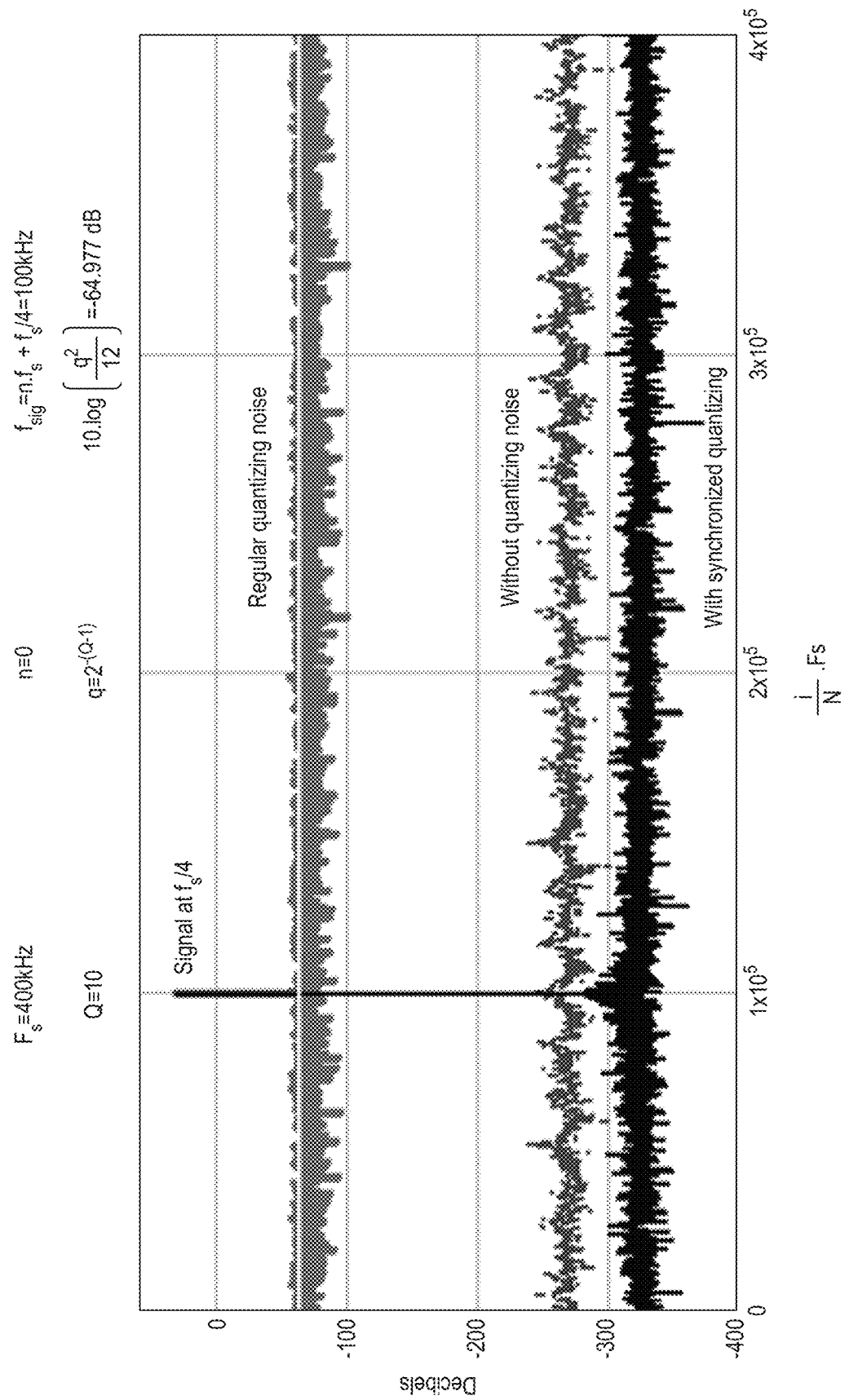
FIG. 2 shows the signal to noise levels achievable using the radar system of the present disclosure.

Referring to FIG. 2, it can be seen that, for a particular clock frequency and integer value for n, the elimination of the quantising noise would reduce the signal to noise level from the order of −65 dB to the order of −270 dB. However, by adopting the synchronised quantizing, the signal to noise level drops further to the order of −320 dB. This aptly demonstrates a significant advantage provided by the arrangement of the disclosure.

As the skilled person understands, the signal frequency needs to satisfy the specified operating window of the digitizer 270, and must be compatible with the filtering requirements that enable control of noise generated in active circuitry. It needs also to avoid flicker noise.

The digital signal produced by the digitiser 270 may be output via the serial programmable interface 110 to onward processing functionality 140 of the digital PCB.

Use of the serial programmable interface 110 to interface between the analogue PCB 200 and the digital PCB 100 means that a commonly available DSP micro-circuit can be used without the need to use a bespoke FPGA (field programmable gate array) for receiving the signal on the digital PCB 100.

In one embodiment, the onward processing circuitry 140 of the digital PCB 100 may output an analogue or digital video signal that embodies a real time video representation of subsurface features as detected by the radar system 1. In another embodiment, the onward processing circuitry 140 of the digital PCB 100 may be associated with global positioning satellite (GPS) technology or other geo-location functionality such that passes of the radar system over a wide area can be coupled with the geo-location data, so as to generate a wide area radar derived map.

One application of the radar system 1 is in the context of a machine work tool.

Figure 3:
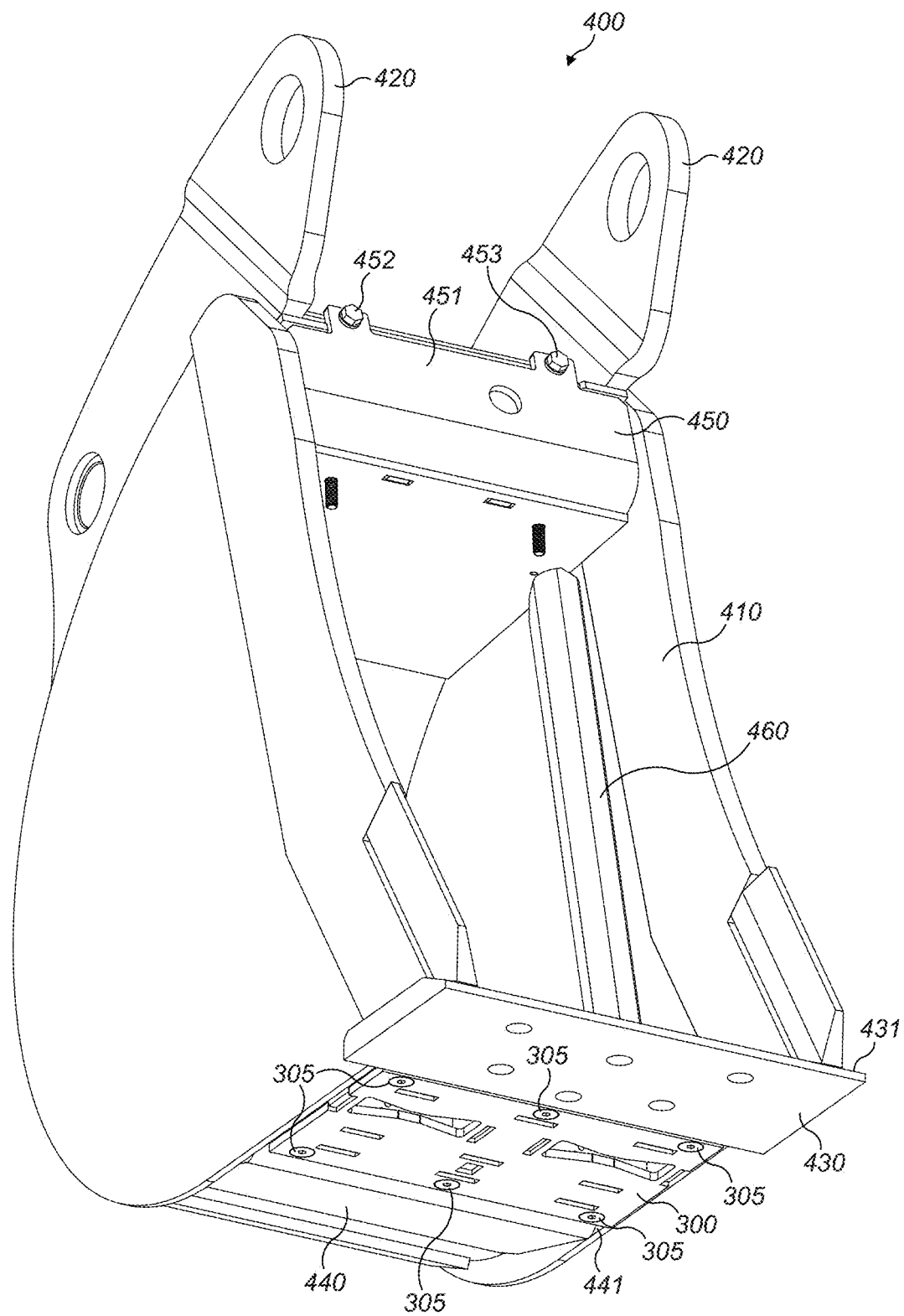
FIG. 3 shows a machine including work tool, wherein the machine comprises a radar system in accordance with the present disclosure.

One embodiment of a machine work tool 400 comprising a radar system 1 of the present disclosure is shown in FIG. 3.

In the illustrated embodiment, the machine work tool 400 takes the form of an excavator bucket 400. The excavator bucket 400 may comprise a bucket cavity 410 for containing excavated material, attachment elements 420 for attachment of the excavator bucket 400 to an excavator (not shown), a bucket blade 430 comprising a front face 431 for cutting into a ground surface or other material to be excavated, and a bottom panel 440 that provides a surface of the excavator bucket 400 that sits adjacent the bucket blade 430. The bottom panel 440 may be above the bucket blade 430 when the excavator bucket 400 is in an orientation such that the bucket blade 430 is in a vertical orientation above a surface into which the bucket blade 430 is preparing to cut.

The excavator bucket 400 may further comprise a top cavity 450, enclosed within the bucket cavity 410 at an opposing face of the bucket 400 relative to the bottom panel 440 and bucket blade 430. The top cavity 450 may comprise a removable panel 451 attached in position by fasteners 452, 453.

The excavator bucket 400 may further comprise one or more conduits 460 within the bucket cavity providing a connection between the bottom panel 440 and the top cavity 450.

The bottom panel 440 may comprise a recess 441 into which is mounted the antenna assembly 300 comprising the transmitter antenna 310 and the receiver antenna 320.

The top cavity 450 may contain the radar control module 2 that comprises the digital PCB 100 and the analogue PCB 200.

Coaxial cables 301, 302 (see FIG. 1) facilitate communication between the antenna assembly 300 and the radar control module 2. The coaxial cables may be channelled in the conduits 460.

Figure 4:
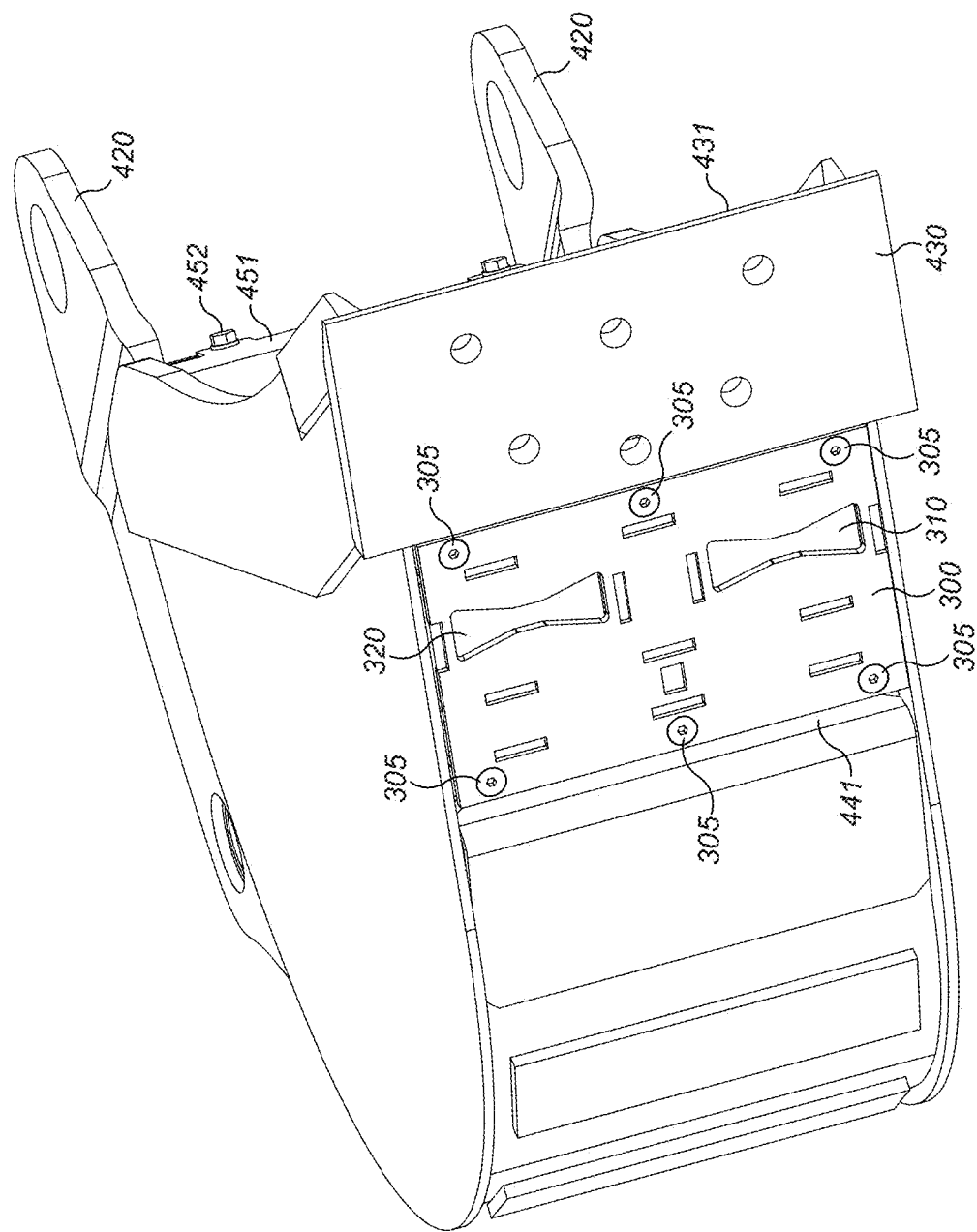
FIG. 4 shows the machine work tool of FIG. 3.

Referring to FIG. 4, a plurality of fasteners 305 may be employed to fasten the antenna assembly 300 into the recess 441 in the bottom panel 440 of the excavator bucket 400. The fasteners may be mounted such that they do not protrude beneath the surface of the bottom panel 440. In this way they are less vulnerable to damage. By contrast, the fasteners may be mounted such that they do protrude above an inner surface of the bucket cavity 410. This is to enable the fasteners to be ground away (for example with an angle grinder) more easily in the event of a need to substitute the antenna assembly 300. While releasable fasteners may be employed, use of an excavator bucket for its intended purposes often means that fasteners may be bent or damaged, meaning that the most efficient method of removing the fasteners may be to grind them away.

In the illustrated embodiment, each fasteners 305 comprises a bolt and a nut. The bolt comprises a head that is flush with the surface of the bottom panel 440. The nut sits inside the excavator bucket and protrudes above an interior surface of the bottom panel 440 of the bucket 400.

The transmitter antenna 310 and receiver antenna 320 may be mounted to the antenna directionally such that they preferentially transmit in a direction towards the blade 430 and preferentially receive from a direction facing the blade 430. The signals that are sent to the transmitter antenna 310 and received from the receiver antenna 320 travel via the coaxial cables 301, 302 as discussed above in relation to FIG. 1.

Also as discussed above in relation to FIG. 1, the signals sent via the coaxial cables 301, 302 are sent to and received from the radar control module 2 which is located within the top cavity 450 of the excavator bucket 400. Separating the radar control module 2 from the antenna assembly 300 means that only those components whose location relative to the cutting blade 430 is significant are located in that manner. By contrast, those elements whose location relative to the cutting blade 430 is not significant, for example those of the radar control module 2, are located at a distance from the cutting blade 430. This means that they may be less vulnerable to damage from impact of the blade 430 and the bottom panel 440 impacting the ground or other materials to be excavated.

Figure 5:
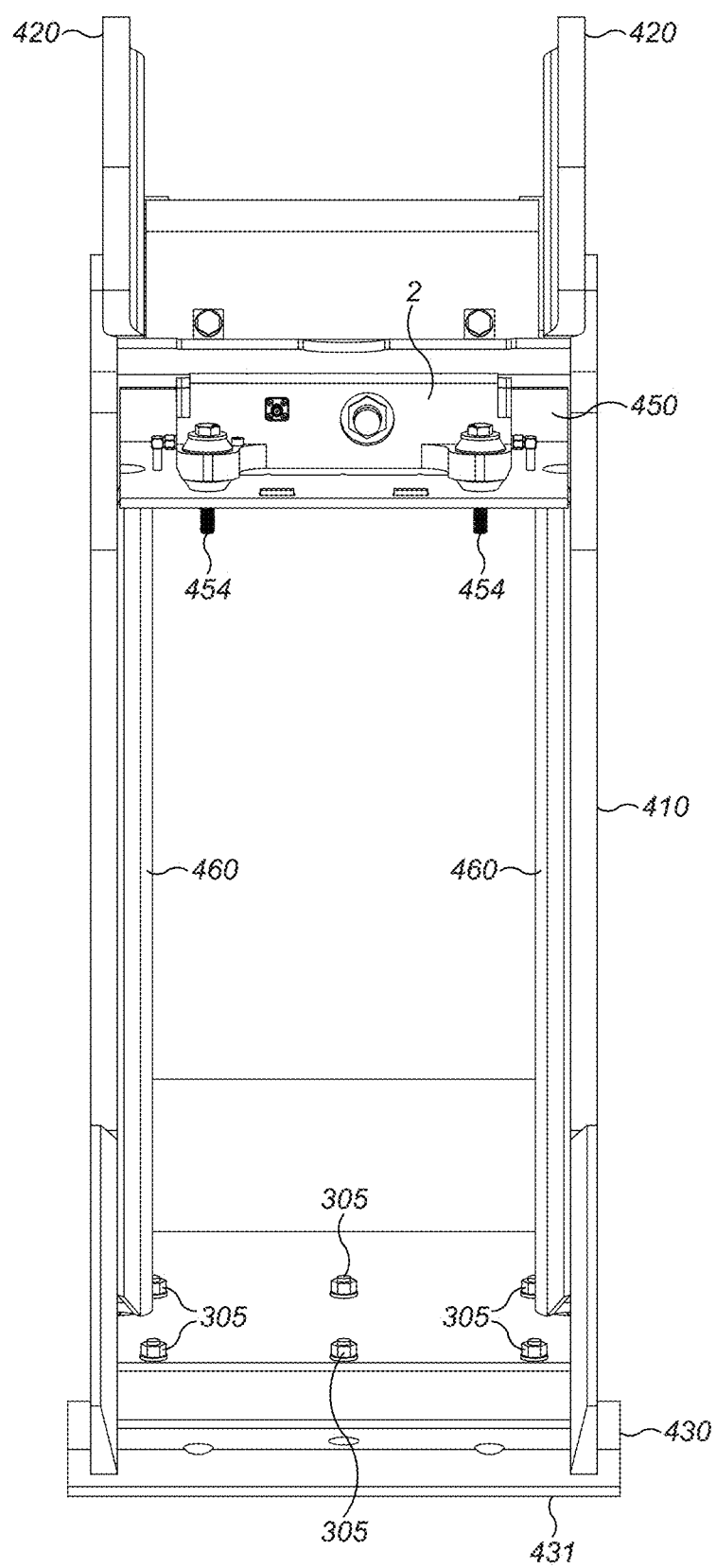
FIG. 5 shows the machine work tool of FIGS. 3 and 4.
Figure 6:
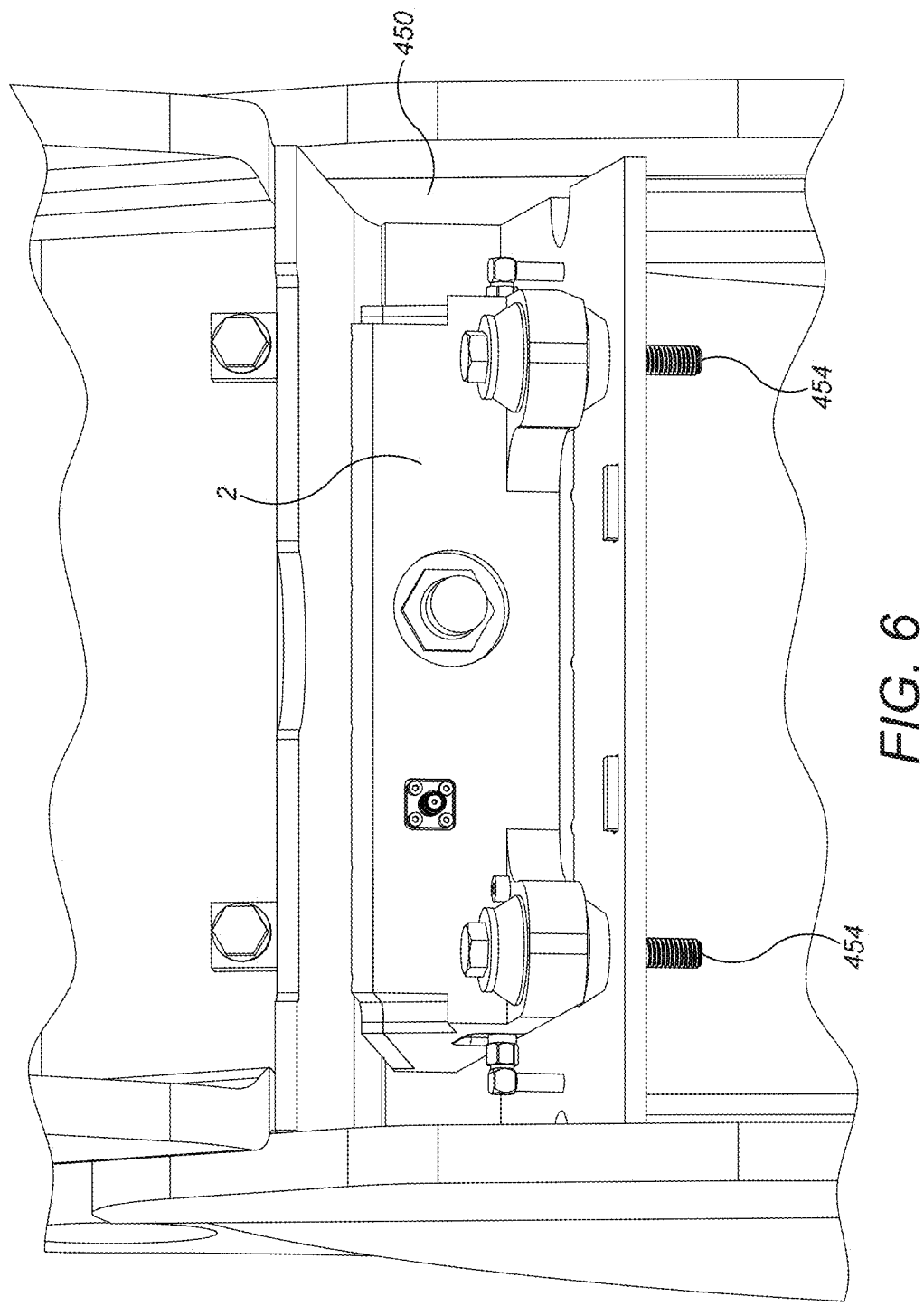
FIG. 6 shows a radar control module of the radar system of FIG. 1 located in a top cavity of the machine work tool of FIGS. 3 to 6.
Figure 7:
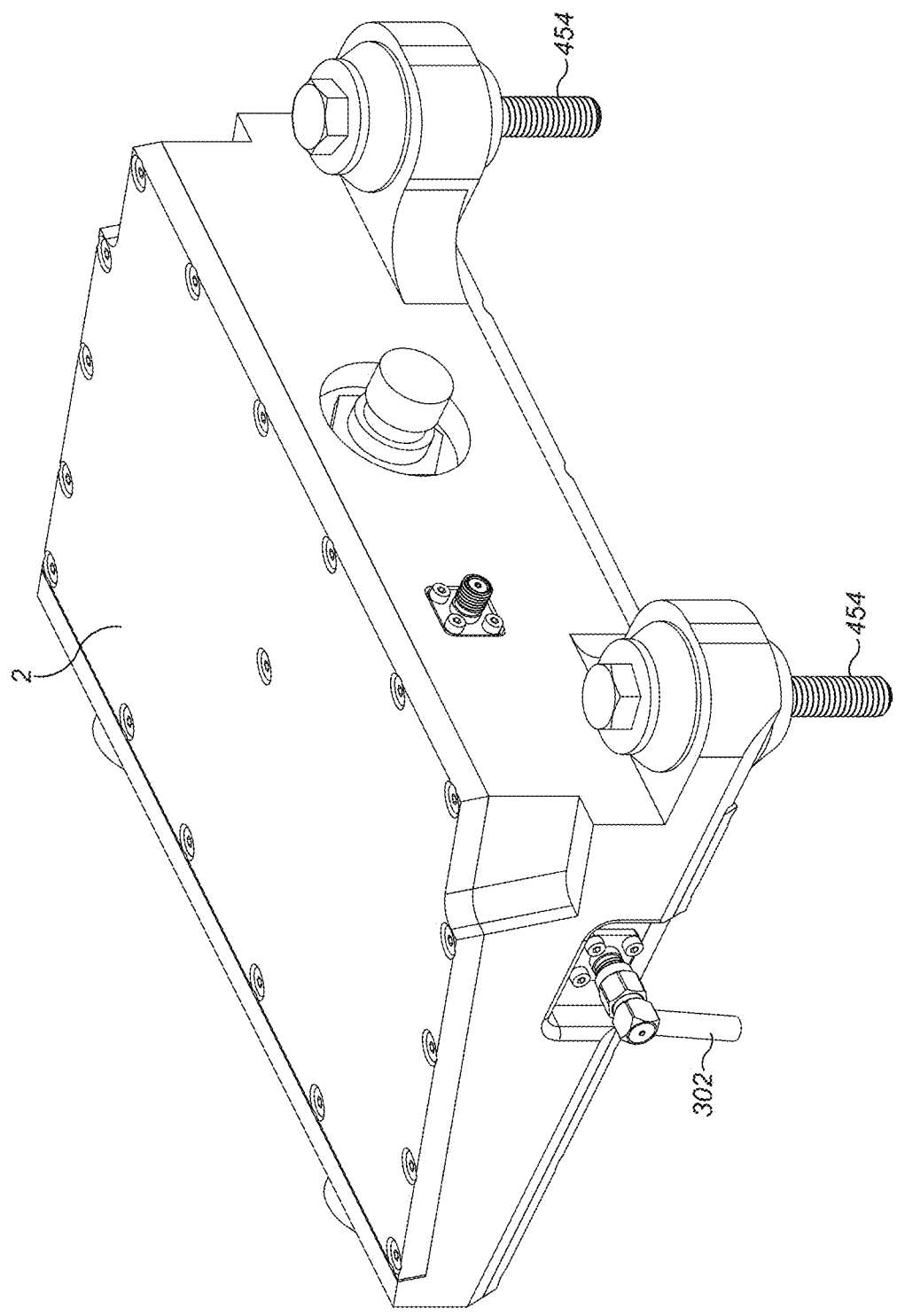
FIG. 7 shows the radar control module 2 of FIG. 6 in isolation.
Figure 8:
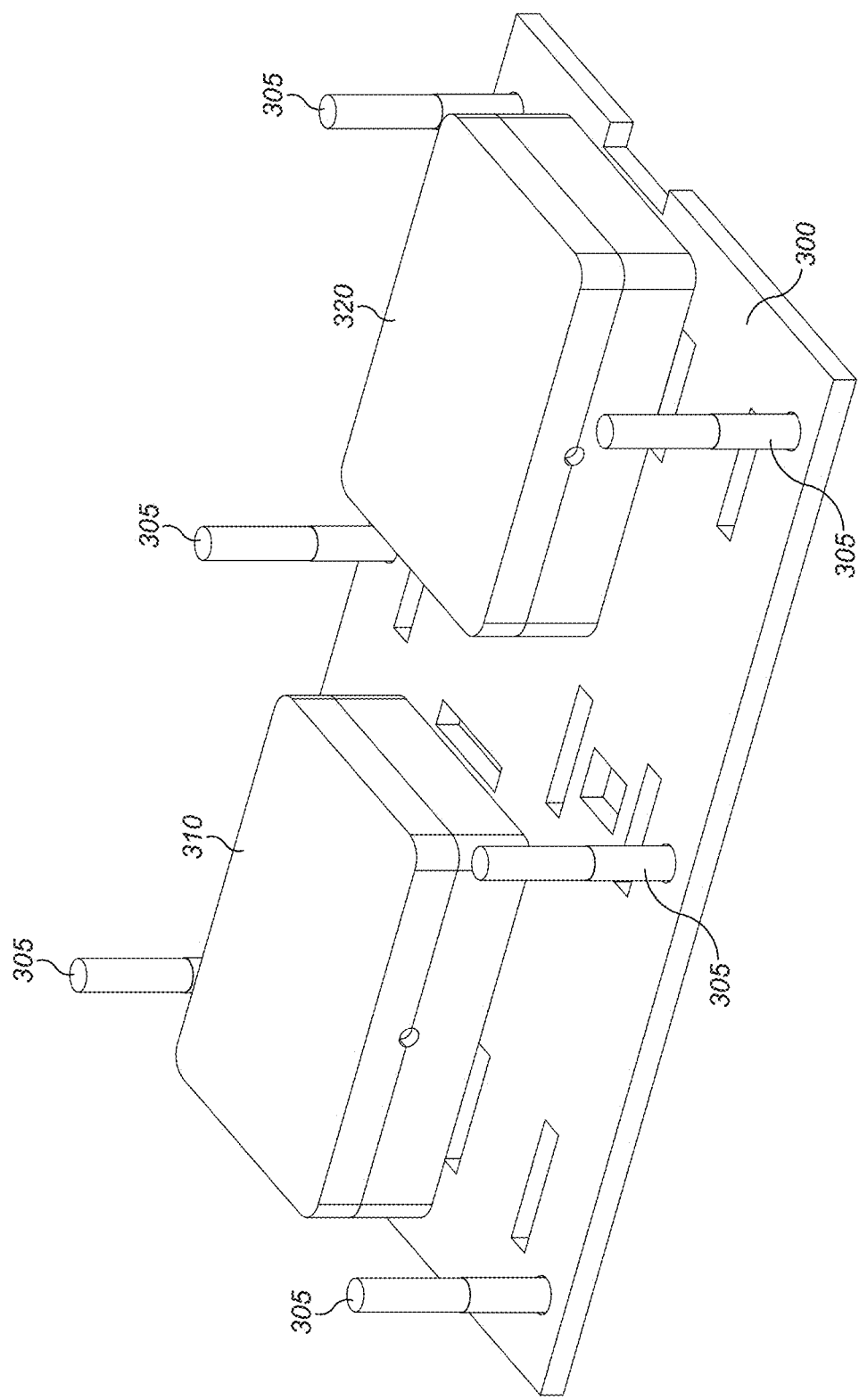
FIG. 8 shows an antenna assembly 300 of the radar system of FIG. 1.

With reference to FIGS. 5 and 6, the radar control module 2 may be fastened within the top cavity 450 using releasable fasteners 454.

While the embodiment illustrated in FIGS. 3 to 9 relates to an excavator bucket 400, it should be noted that the claimed radar system is applicable to a much wider range of potential embodiments. For example, other embodiments would include other machine work tools such as breakers and drilling tools.

Looking outside the field of machines with work tools, other embodiments would include airborne vehicles, including autonomous aircraft such as drones. These embodiments may be particularly useful for applications where the aim of a subterranean profile is sought, perhaps in anticipation of construction work. Such embodiments may involve the obtaining of geo-location data to be matched with the radar system output information in order build a subterranean map of the area that is subject to the radar system analysis.

The radar system of the present disclosure is particularly appropriate for low cost applications, such as in machine work tools, where a whole range of tools may require the system and where the environment of the tool is such that component replacement may be more frequent than in other radar applications. Furthermore, the radar system of the disclosure is a low power solution by comparison with many prior art radar systems and, accordingly, it is appropriate for applications where low power is a particular benefit, such as in the context of small scale autonomous aircraft, having small battery packs and where there is a desire for the radar system to have minimal impact on flying range.

The radar system of the present disclosure is not limited to ground penetration applications.

INDUSTRIAL APPLICABILITY

The radar system of the present disclosure is applicable to a wide variety of industrial applications such as those referenced above. In particular, the radar system of the disclosure, may be appropriate for ground penetration applications. For example, the radar system may be appropriate for use with machine work tools such that feedback may be provided to an operator in real time which allows immediate feedback prior to cutting into the ground. This enables subterranean features to be found and/or avoided as appropriate. In another example, the radar system may be appropriate for surveying applications. Surveying applications may involve mounting the radar system in an airborne vehicle or in a ground vehicle designed to complete a survey of a site perhaps by making a systematic pass (e.g. in rows or columns) across the site to be surveyed.

The invention claimed is:
1. A radar system configured for detecting profiles of objects within an environment, the radar system comprising:
   an analogue printed circuit board (PCB) configured to generate a digitised output with synchronized quantizing noise; and
   a digital PCB comprising:
      a processor configured to receive the digitised output and provide it to radar data interpretation software configured to translate the output into an indication of profiles of objects in the environment,
      a master clock signal generator configured to generate a master clock signal having a frequency f; and
      a sampling frequency generator configured to use the master clock signal to generate a sampling frequency output signal having a frequency

$$f_s = \frac{f}{m},$$

where m is an integer;
   wherein the analogue PCB comprises:
      a transmission signal generator configured to use the master clock signal to generate a transmission signal $RF_{out}$ for transmission at a frequency $f_0 = pf$ where p is an integer;
      a direct digital synthesiser configured to receive the sampling frequency output signal to produce a synthesiser output signal with an offset frequency synchronous to said master clock frequency f and defined by $$n \cdot f_s + \frac{f_s}{4},$$

where n is an integer;
      an up-converter comprising a quadrature mixer, single-side-band mixer or complex mixer configured to receive the transmission signal $RF_{out}$ and mix it with the synthesiser output signal to produce an up-converter output having a frequency of $$f_0 + \left(n \cdot f_s + \frac{f_s}{4}\right);$$

a down-converter comprising a passive double balanced mixer configured to mix the up-converter output with a received signal $RF_{in}$, wherein $RF_{in}$ comprises the transmission signal $RF_{out}$ as reflected by the environment, and thereby to generate as a down-converter output having a frequency of $$n \cdot f_s + \frac{f_s}{4};$$

and
      a digitiser configured to receive the down-converter output and to sample the down-converter output at said sampling frequency to produce thereby said digitised output with said synchronized quantizing noise.
2. The radar system of claim 1 further comprising:
   a first directional antenna configured to transmit the transmission signal $RF_{out}$ into the environment.
3. The radar system of claim 1 further comprising:
   a second directional antenna configured to receive the received signal $RF_{in}$ corresponding to the transmission signal $RF_{out}$ as reflected by the environment.
4. The radar system of claim 1 wherein the digital PCB comprises a serial programmable interface by which data is transferred between the digital PCB and the analogue PCB and between the analogue PCB and the digital PCB.
5. The radar system of claim 4 wherein the digital PCB comprises an automatic gain controller configured to provide an automatic gain control signal to the transmission signal generator.
6. The radar system of claim 5 wherein the automatic gain control signal is output to the transmission signal generator via the serial programmable interface.
7. The radar system of claim 1 wherein the digital PCB comprises an input gain controller configured to provide a gain control signal to a radio frequency receiver of the analogue PCB.

8. The radar system of claim 1 wherein the master clock signal frequency f is 10 MHz.

9. The radar system of claim 1 wherein the integer m is 25.

10. The radar system of claim 1 wherein the sampling frequency $f_s$ is 400 kHz.

11. The radar system of claim 1 wherein the integer n is one of the following: 0, 1, 2, 3, or 4.

12. The radar system of claim 1 wherein $$n \cdot f_s + \frac{f_s}{4}$$

is one of the following: 100 kHz, 500 kHz, 900 kHz, 1,300 kHz or 1,700 kHz.

13. A work tool for a machine, the work tool comprising the radar system of claim 1.

* * * * *